(12) United States Patent
Pannocchia et al.

(10) Patent No.: US 11,767,610 B2
(45) Date of Patent: Sep. 26, 2023

(54) USE OF BUFFER MEMBERS DURING GROWTH OF SINGLE CRYSTAL SILICON INGOTS

(71) Applicant: GlobalWafers Co., Ltd., Hsinchu (TW)

(72) Inventors: Matteo Pannocchia, Lana (IT); Francesca Marchese, Merano (IT); James Ho Wai Kitt, Lana (IT)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/553,031

(22) Filed: Dec. 16, 2021

(65) Prior Publication Data

US 2022/0205129 A1 Jun. 30, 2022

Related U.S. Application Data

(60) Provisional application No. 63/132,713, filed on Dec. 31, 2020, provisional application No. 63/132,712, filed on Dec. 31, 2020.

(51) Int. Cl.
| | | |
|---|---|---|
| *C30B 15/00* | (2006.01) | |
| *C30B 15/12* | (2006.01) | |
| *C30B 15/20* | (2006.01) | |
| *C30B 29/06* | (2006.01) | |

(52) U.S. Cl.
CPC ............ *C30B 15/002* (2013.01); *C30B 15/12* (2013.01); *C30B 15/20* (2013.01); *C30B 29/06* (2013.01)

(58) Field of Classification Search
CPC ....... C30B 15/002; C30B 15/02; C30B 15/12; C30B 15/20; C30B 29/06
See application file for complete search history.

(56) References Cited

U.S. PATENT DOCUMENTS

| | | | |
|---|---|---|---|
| 7,635,414 B2 | 12/2009 | Bender | |
| 2002/0081440 A1* | 6/2002 | Murakami | C30B 15/14 428/64.1 |
| 2004/0025983 A1* | 2/2004 | Morita | C30B 29/06 148/562 |
| 2004/0083947 A1* | 5/2004 | Weber | C30B 29/06 117/19 |
| 2011/0052923 A1* | 3/2011 | Umeno | C30B 15/00 252/500 |
| 2018/0187329 A1* | 7/2018 | Zepeda | C30B 15/002 |
| 2018/0291524 A1* | 10/2018 | Basak | C30B 15/04 |
| 2018/0320287 A1 | 11/2018 | Zepeda et al. | |

FOREIGN PATENT DOCUMENTS

WO 2018129141 A1 7/2018

\* cited by examiner

*Primary Examiner* — Hua Qi
(74) *Attorney, Agent, or Firm* — Armstrong Teasdale LLP

(57) ABSTRACT

Methods for producing single crystal silicon ingots by Continuous Czochralski (CCz) are disclosed. A batch of buffer members (e.g., quartz cullets) is added to an outer melt zone of the crucible assembly before the main body of the ingot is grown. In some embodiments, the ratio of the mass M of the batch of buffer members added to the melt to the time between adding the batch of buffer members to the melt and when the ingot main body begins to grow is controlled such that the ratio of M/T is greater than a threshold M/T.

16 Claims, 9 Drawing Sheets

USE OF BUFFER MEMBERS DURING GROWTH OF SINGLE CRYSTAL SILICON INGOTS

CROSS-REFERENCE TO RELATED APPLICATIONS

This application claims the benefit of U.S. Provisional Patent Application No. 63/132,712, filed Dec. 31, 2020, and U.S. Provisional Patent Application No. 63/132,713, filed Dec. 31, 2020. Both applications are incorporated herein by reference in their entirety.

FIELD OF THE DISCLOSURE

The field of the disclosure relates to methods for producing single crystal silicon ingots by Continuous Czochralski (CCz) and, in particular, methods in which buffer members are added to an outer melt zone of the crucible assembly.

BACKGROUND

Continuous Czochralski (CCz) is well suited to form 300 mm or 200 mm diameter single crystal silicon ingots such as ingots that are relative heavily doped with arsenic or phosphorous. Continuous Czochralski methods involve forming a single crystal silicon ingot from a melt of silicon while continuously or intermittently adding solid polycrystalline silicon to the melt to replenish the melt while the ingot is grown. The methods may involve forming multiple ingots from the same melt while the hot zone remains at temperature (i.e., with a melt continuously being present in the crucible assembly while the plurality of ingots is grown).

Customers increasingly specify that wafers sliced from ingots grown by continuous Czochralski methods have a low void count (e.g., less than 30 defects per wafer) for both 200 mm and 300 mm ingots. Continuous Czochralski methods may involve a crucible assembly that includes at least two and often three melt zones that are separated by physical barriers—an outer melt zone into which solid polycrystalline silicon is fed, a middle melt zone in which the melt stabilizes, and an inner melt zone from which the silicon ingot is pulled. Addition of solid polycrystalline silicon to the melt causes inert gas bubbles (e.g., argon bubbles) to form in the melt which impacts the void count.

A need exists for methods for forming silicon ingots which reduce the defect count in silicon wafers sliced from the ingot and/or in which inert gas bubble formation in the melt is reduced or which promote dissipation of the inert gas bubbles.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for growing a single crystal silicon ingot in a continuous Czochralski process. A melt of silicon is formed in a crucible assembly. A batch of buffer members is added to the melt. The batch has a mass M. A surface of the melt is contacted with a seed crystal. A single crystal silicon ingot is withdrawn from the melt. The single crystal silicon ingot includes a main body. There is a time T between adding the batch of buffer members to the melt and start of growth of the main body. The ratio of M/T is controlled to be greater than a threshold M/T to reduce void counts in wafers sliced from the single crystal silicon ingot. Solid polycrystalline silicon feedstock is added to the crucible while withdrawing the single crystal silicon ingot to replenish the melt.

One aspect of the present disclosure is directed to a method for determining a threshold ratio of M/T for growing a single crystal silicon ingot in a continuous Czochralski process. The continuous Czochralski process includes forming a melt of silicon in a crucible assembly, adding a batch of buffer members to the melt with the batch having a mass M, contacting a surface of the melt with a seed crystal, withdrawing a single crystal silicon ingot from the melt, the single crystal silicon ingot comprising a main body, there being a time T between adding the batch of buffer members to the melt and start of growth of the main body, and adding solid polycrystalline silicon feedstock to the crucible assembly while withdrawing the single crystal silicon ingot to replenish the melt. The method for determining the threshold ratio of M/T includes growing a plurality of single crystal silicon ingots with at least two of the ingots being grown with different ratios of M/T. A defect count in one or more wafers sliced from the plurality of single crystal silicon ingots is measured. The ratio of M/T for single crystal silicon ingots from which wafers were sliced having a defect count below a threshold defect count is determined.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for growing a single crystal silicon ingot in a continuous Czochralski (CCz) process. Buffer members (e.g., quartz cullets) are added to the melt of silicon prior to formation of the main body of the ingot. The ratio of the mass M of buffer members that are added to the time T between addition of the buffer members and the start of growth of the main body of the ingot is controlled to be greater than a threshold M/T. By controlling the ratio (M/T) of the mass of buffer members to the time until the ingot main body starts to grow to be greater than the threshold M/T, the amount of defects in the resulting silicon wafers may be reduced.

Figure 3:
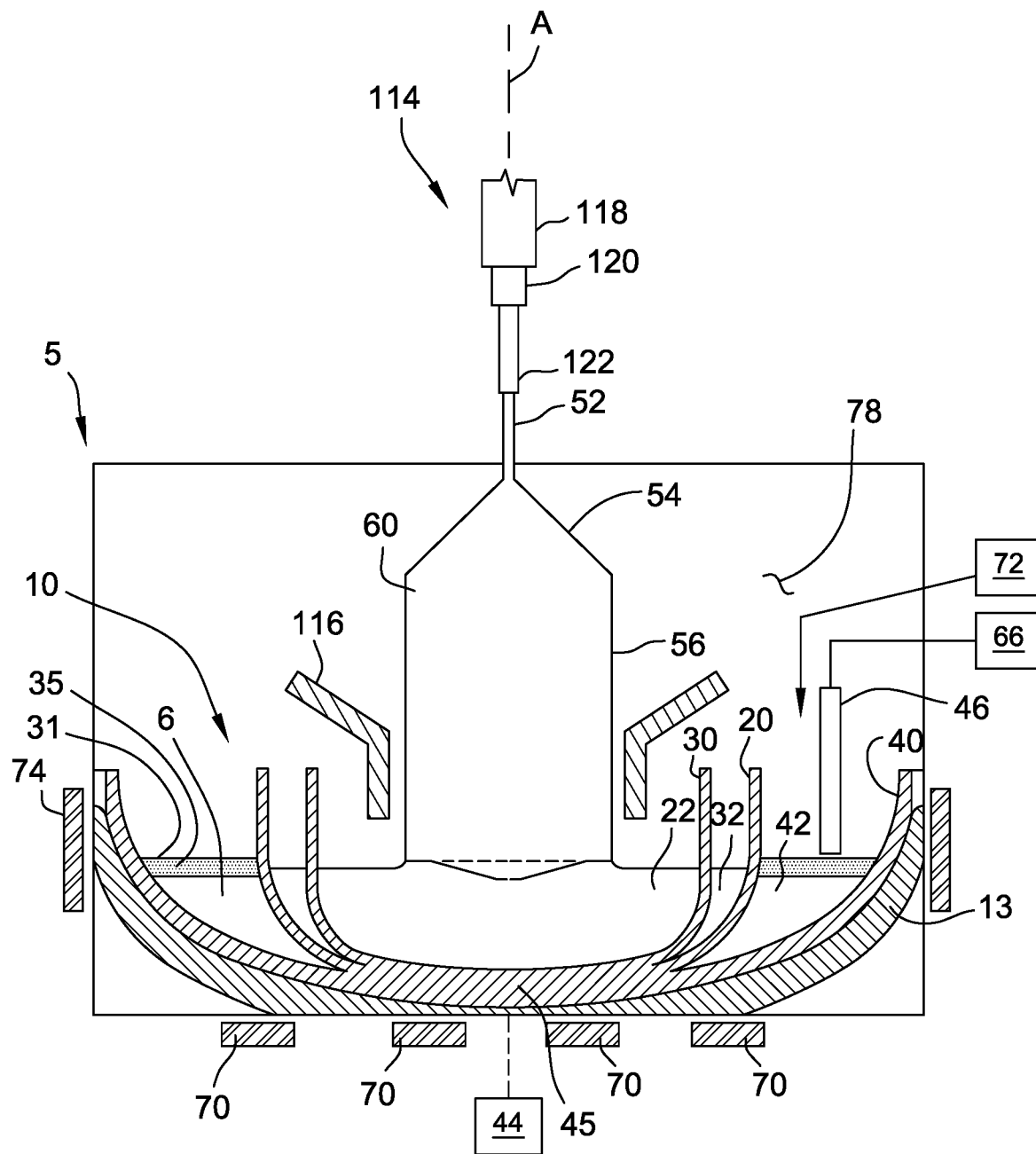
FIG. 3 is a cross-section view of the ingot puller apparatus showing a silicon ingot being pulled from the silicon melt.

An example ingot puller apparatus 5 for producing an ingot 60 by a continuous Czochralski process is shown in FIG. 3. The ingot puller apparatus 5 includes a crucible assembly 10 that contains a melt 6 of semiconductor or solar grade silicon material. A susceptor 13 supports the crucible assembly 10. The crucible assembly 10 has a sidewall 40 and one or more fluid barriers 20, 30 or "weirs" that separate the melt into different melt zones. In the illustrated embodiment, the crucible assembly 10 includes a first weir 20. The first weir 20 and sidewall 40 define an outer melt zone 42 of the silicon melt. The crucible assembly 10 includes a second weir 30 radially inward to the first weir 20 which defines an inner melt zone 22 of the silicon melt. The inner melt zone 22 is the growth region from which the single crystal silicon ingot 60 is grown. The first weir 20 and a second weir 30 define a middle melt zone 32 of the silicon melt in which the melt 6 may stabilize as it moves toward the inner melt zone 22. The first and second weirs 20, 30 each have at least one opening defined therein to permit molten silicon to flow radially inward towards the growth region of the inner melt zone 22.

Figure 1:
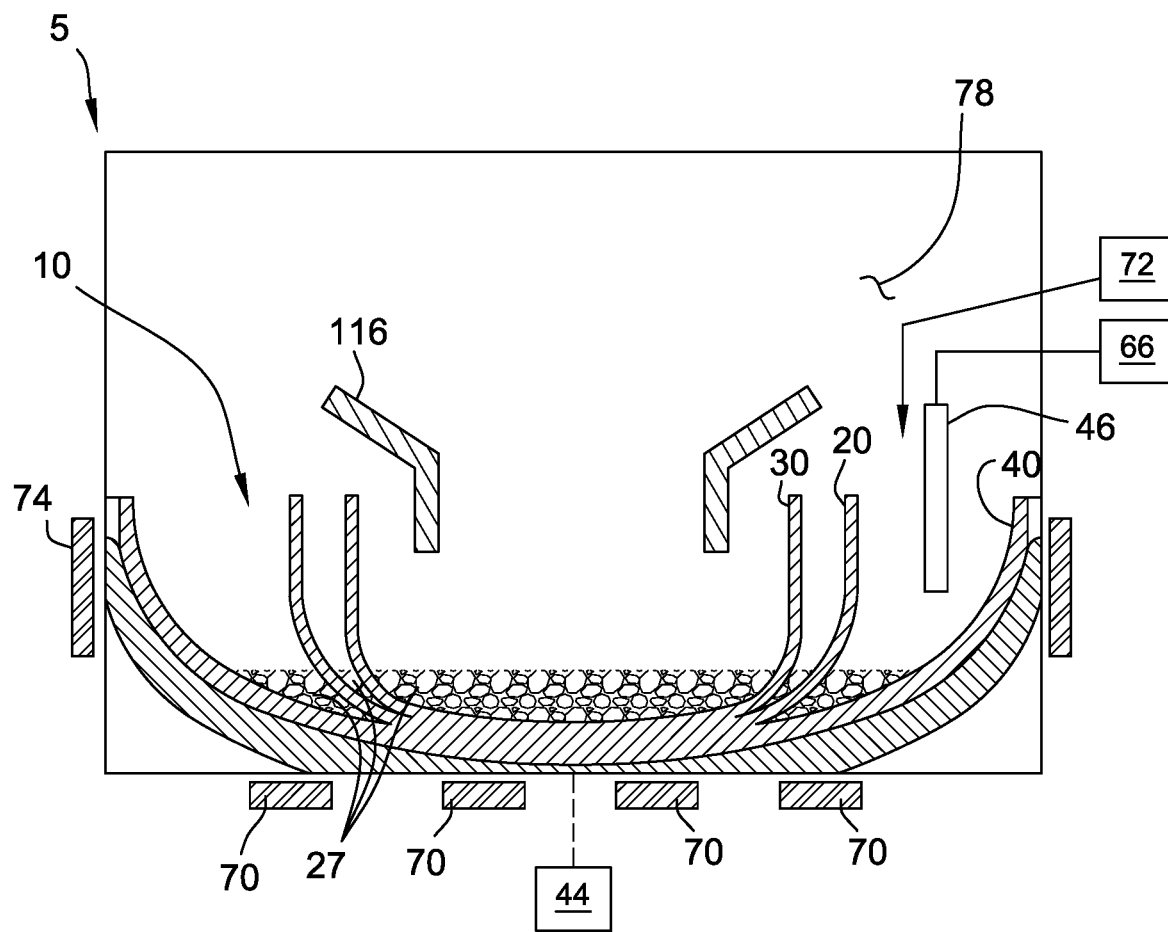
FIG. 1 is a cross-section view of an example ingot puller apparatus having a solid polycrystalline silicon charge disposed therein.
Figure 2:
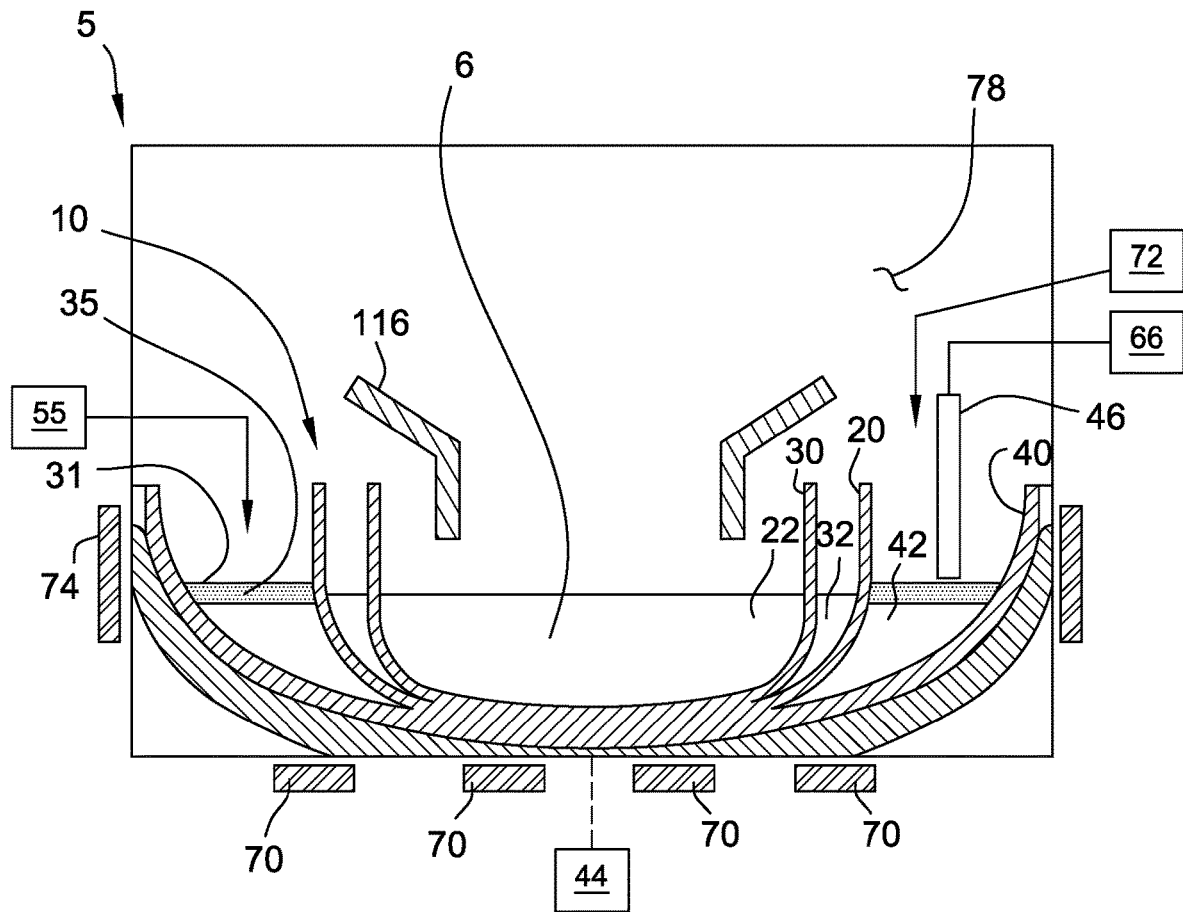
FIG. 2 is a cross-section view of the ingot puller apparatus having a melt with buffer members within the melt.

In the illustrated embodiment, the first weir 20, second weir 30 and sidewall 40 each have a generally annular shape. The first weir 20, second weir 30 and sidewall 40 may be part of three nested crucibles which are joined at the bottom or floor 45 of the crucible assembly 10 (i.e., the first and second weirs 20, 30 are the sidewalls of two crucibles nested within a larger crucible). The crucible assembly configuration depicted in FIGS. 1-3 is exemplary. In other embodiments, the crucible assembly 10 has a single layer floor (i.e., does not have nested crucibles) with the weirs extending upward from the floor 45. Optionally, the floor 45 may be flat rather than curved and/or the weirs 20, 30 and/or sidewall 40 may be straight-sided. Further, while the illustrated crucible assembly 10 is shown with two weirs, in other embodiments the crucible assembly may have a single weir or even no weirs.

A feeding tube 46 feeds polycrystalline silicon which may be, for example, granular, chunk, or a combination of granular and chunk, into the outer melt zone 42 at a rate sufficient to maintain a substantially constant melt elevation level and volume during growth of the ingot 60.

Generally, the melt 6 from which the ingot 60 is drawn is formed by loading polycrystalline silicon into a crucible to form an initial silicon charge 27 (FIG. 1). In general, an initial charge is between about 10 kilograms and about 200 kilograms of polycrystalline silicon, which may be granular, chunk, or a combination of granular and chunk. The mass of the initial charges depends on the desired crystal diameter and hot zone design. Initial charge does not reflect the length of the ingot crystal, because polycrystalline silicon is continuously fed during crystal growth.

A variety of sources of polycrystalline silicon may be used including, for example, granular polycrystalline silicon produced by thermal decomposition of silane or a halosilane in a fluidized bed reactor or polycrystalline silicon produced in a Siemens reactor. As described below, an amount of buffer members may be added to the initial charge 27 of polycrystalline silicon in the outer melt zone 42 of the crucible assembly 10 prior to or during melting the initial charge 27 of polycrystalline silicon.

Once polycrystalline silicon (and optionally buffer members) is added to the crucible assembly 10 to form a charge 27, the charge 27 is heated to a temperature above about the melting temperature of silicon (e.g., about 1412° C.) to melt the charge, and thereby form a silicon melt 6 (FIG. 2) comprising molten silicon. The silicon melt 6 has an initial volume of molten silicon and has an initial melt elevation level, and these parameters are determined by the size of the initial charge 27. In some embodiments, the crucible assembly 10 comprising the silicon melt 6 is heated to a temperature of at least about 1425° C., at least about 1450° C. or even at least about 1500° C.

The ingot pulling apparatus 5 includes a pulling mechanism 114 (FIG. 3) for growing and pulling the ingot 60 from the melt within the inner melt zone 22. The pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a lifting mechanism (e.g., driven pulley or drum, or any other suitable type of lifting mechanism) and the other end is connected to the chuck 120 that holds the seed crystal 122. In operation, the seed crystal 122 is lowered to contact the melt 6 in the inner melt zone 22. The pulling mechanism 114 is operated to cause the seed crystal 122 to rise along pull axis A. This causes a single crystal ingot 60 to be pulled from the melt 6.

Once the charge 27 (FIG. 1) of polycrystalline silicon is liquefied to form a silicon melt 6 (FIG. 2) comprising molten silicon, the silicon seed crystal 122 (FIG. 3) is lowered to contact the melt 6 within the inner melt zone 22. The silicon seed crystal 122 is then withdrawn from the melt 6 with silicon being attached thereto to form a neck 52 thereby forming a melt-solid interface near or at the surface of the melt 6.

The pulling mechanism 114 may rotate the seed crystal 122 and ingot 60 connected thereto. A crucible drive unit 44 may rotate the susceptor 13 and crucible assembly 10. In some embodiments, the silicon seed crystal 122 and the crucible assembly 10 are rotated in opposite directions, i.e., counter-rotation. Counter-rotation achieves convection in the silicon melt 6. Rotation of the seed crystal 122 is mainly used to provide a symmetric temperature profile, suppress angular variation of impurities and also to control crystal melt interface shape.

After formation of the neck 52, an outwardly flaring seed-cone portion 54 (or "crown") adjacent the neck 52 is grown. In general, the pull rate is decreased from the neck portion pull rate to a rate suitable for growing the outwardly flaring seed-cone portion 54. Once the seed-cone portion reaches the target diameter, the many body 56 or "constant-diameter portion" of the ingot 60 is grown. In some embodiments, the main body 56 of the ingot 60 has a diameter of about 150 mm, at least about 150 mm, about 200 mm, at least about 200 mm, about 300 mm, at least about 300 mm, about 450 mm, or even at least about 450 mm.

While the ingot 60 is pulled from the melt 6, solid polysilicon feedstock is added to the outer melt zone 42 through the tube 46 or other channel to replenish the melt 6 in the ingot growth apparatus 5. Solid polycrystalline silicon may be added from a polycrystalline silicon feed system 66 and may be continuously or intermittently added to the ingot puller apparatus 5 to maintain the melt level. Generally, polycrystalline silicon may be metered into the ingot puller apparatus 5 by any method available to those of skill in the art.

In some embodiments, dopant is also added to the melt 6 during ingot growth. Dopant may be introduced from a dopant feed system 72. Dopant may be added as a gas or solid and may be added to the outer melt zone 42.

The apparatus 5 may include a heat shield 116 disposed about the ingot 60 to permit the growing ingot 60 to radiate its latent heat of solidification and thermal flux from the melt 6. The heat shield 116 may be at least partially conical in shape and angles downwardly at an angle to create an annular opening in which the ingot 60 is disposed. A flow of an inert gas, such as argon, is typically provided along the length of the growing crystal. The ingot 60 is pulled through a growth chamber 78 that is sealed from the surrounding atmosphere.

A plurality of independently controlled annular bottom heaters 70 may be disposed in a radial pattern beneath the crucible assembly 10. Annular bottom heaters 70 apply heat in a relatively controlled distribution across the entire base surface area of the crucible assembly 10. The annular bottom heaters 70 may be planar resistive heating elements that are individually controlled as described in U.S. Pat. No. 7,635,414, which is incorporated herein by reference for all relevant and consistent purposes. The apparatus 5 may include one or more side heaters 74 disposed radially outward to the crucible assembly 10 to control the temperature distribution through melt 6.

The ingot growth apparatus 5 shown in FIGS. 1-3 and described herein is exemplary and generally any system in which a crystal ingot is prepared by a continuous Czochralski method may be used unless stated otherwise.

In accordance with embodiments of the present disclosure, before the ingot 60 is grown, a batch 31 (FIG. 2) of buffer members 35 (e.g., quartz cullets) are added to the silicon melt 6 and, in particular, to the outer melt zone 42. The buffer members 35 may be less dense than the melt 6 of silicon such that the buffer members 35 float within the melt 6 (i.e., a portion is disposed on the surface of the melt 6). Suitable buffer members 35 which may be added to the outer melt zone 42 include, for example, solid materials which prevent the polysilicon added through the feeding tube 46 from directly entering the melt 6 and/or that provide surface area for dissipation of inert gas bubbles. The buffer members 35 may form gaps between the buffer members 35. The buffer members 35 may be free to move (e.g., when impacted by falling polycrystalline feedstock). In some embodiments, the buffer members 35 include quartz such as quartz cullets. When quartz cullets are used, the cullets may have any suitable shape (e.g., cylindrical) and any suitable size (e.g., about 1 mm to 10 mm in diameter and/or about 1 mm to about 10 mm in length when cylindrical cullets are used).

After the batch 31 of buffer members 35 is added to the melt 6, the ingot 60 is pulled from the melt 6. In accordance with embodiments of the present disclosure, the ratio of the mass M of the batch 31 of buffer members 35 added to the melt 6 to the time T between adding the batch 31 of buffer members 35 to the melt 6 and when the ingot main body 56 (FIG. 3) begins to grow is controlled such that the ratio of M/T is greater than a threshold ratio of M/T to reduce void counts in wafers sliced from the single crystal silicon ingot. Generally, the time T corresponds to the time at which the batch 31 of buffer members 35 has been fully added and when the ingot main body 56 begins to grow.

In some embodiments, the ratio of M/T is controlled to be greater than a threshold M/T such that wafers sliced from the single crystal silicon ingot have a void count of less than 30 defects of a size of 0.2 μm or more or even have a void count of less than 20 defects of a size of 0.2 μm or more. The threshold M/T may vary depending on the hot zone design of the ingot puller apparatus. To determine the threshold M/T, a threshold defect count (e.g., a maximum defect count desired by the manufacturer and/or customer such as less than 30 defects, less than 20 defect or less than 10 defects of a size of 0.2 μm or more) is established. A plurality of single crystal silicon ingots are grown in which at least two of the ingots (e.g., 2, 3, 5, 10, 25, 100 ingots) are grown with different ratios of M/T. The defect count in one or more wafers sliced from the plurality of single crystal silicon ingots is measured (e.g., with an SP1 inspection tool). The ratio of M/T for single crystal silicon ingots from which wafers were sliced that have a defect count below the threshold defect count is determined based on the measured defect counts (i.e., a threshold M/T is determined based on M/T values in which the defect count was at or below the defect threshold count).

In some embodiments, the threshold M/T at which M/T is controlled to be greater than is 40 grams per hour. In other embodiments, the threshold M/T is 50 grams per hour or even 55 grams per hour. In some embodiments, the threshold M/T at which M/T is controlled to be greater than is 60 grams per hour. In yet other embodiments, the threshold M/T at which M/T is controlled to be greater than is 70 grams per hour. The threshold M/T (and actual M/T used in the ingot puller apparatus to grow an ingot) may be bound by the practical limits of the ingot growth process (e.g., without inhibiting flow of solid polysilicon into the melt such as when solid polysilicon begins to mound on top of the buffer members). For example, M/T can be controlled to be above a threshold M/T listed above and less than 500 grams per hour or even less than 250 grams per hour.

As shown in FIG. 2 and in accordance with some embodiments of the present disclosure, the batch 31 of buffer members 35 may be sufficiently large such that the buffer members 35 continuously extend from the sidewall 40 of the crucible assembly 10 to the first weir 20.

In this regard, the mass M of the batch 31 of buffer members 35 (e.g., quartz cullets) generally excludes any buffer members that were added before the initial charge 27 (FIG. 1) was melted down (i.e., excludes an initial charge of buffer members added to the solid polycrystalline charge).

To control the ratio of M/T such that the ratio of M/T is greater than the threshold M/T, the mass M of the batch 31 of buffer members 35 added to the outer melt zone 42 may be increased or the time T between addition of buffer members and growth of the main body 56 of the ingot 60 may be decreased (e.g., by adding buffer members later, i.e., closer to when the ingot main body 56 begins to grow). It should be noted that controlling M/T to be "greater than" a threshold M/T generally includes any method in which a minimum M/T is chosen or established for use in an ingot growth process (i.e., includes embodiments in which M/T in the ingot growth process is "equal to" or greater than a minimum or, in other words, the threshold M/T is a unit below the minimum M/T that is chosen such that M/T is greater than the threshold).

As the ingot 60 is withdrawn from the melt 6, solid polycrystalline silicon feedstock is added to the crucible assembly 10 while withdrawing the single crystal silicon ingot 60 to replenish the melt 6. In some embodiments, buffer members 35 are not added to the melt while the ingot is grown (e.g., neck, crown and/or main body). If buffer members are added during growth of the neck 52 and/or crown 54 as in other embodiments of the present disclosure, the mass M of the batch 31 of buffer members 35 may include any buffer members 35 added while the seed crystal 122 (FIG. 3) is lowered and/or added during growth of the neck 52 and crown 54 of the ingot 60, as well as any buffer members added prior to lowering of the seed crystal 122 (and subsequent to melting the charge of solid polycrystalline silicon and/or subsequent to termination of growth of the previous ingot, if any). In some embodiments of the present disclosure, buffer members 35 are not added while the ingot main body 56 is pulled from the melt 6. If buffer members 35 are added during growth of the ingot main body 56, such buffer members 35 are not considered to be part of the batch 31 added prior to growth of the main body 56 of the ingot 60 (i.e., are not part of the mass M of the batch 31).

In some continuous Czochralski processes, more than one ingot is grown while the hot zone (i.e., lower portion of the apparatus 5 such as the crucible assembly 10 and the susceptor 13) remains heated with silicon melt 6 being continuously within the crucible assembly 10. In such methods, a first ingot is grown to a target length and growth is terminated, the ingot is removed from the ingot puller, and a seed crystal is then lowered into the melt to initiate growth of a second single crystal silicon ingot (i.e., using the same melt from which the first ingot was withdrawn). Subsequent ingots may be grown with the hot zone intact and at temperature with a continuous melt of silicon being within the crucible assembly 10 (e.g., until one or more components of the hot zone have degraded such as the crucible assembly requiring cool-down and replacement of the degraded component). For example, at least 1, 2, 3, 4, 5, 6, 10, or 20 or more ingots may be grown.

After growth of the first ingot 60 is terminated and the ingot is removed (e.g., removed from a pull chamber of the ingot puller apparatus 10), a second batch of buffer members may be added to the melt that remains after the first ingot has been removed. A seed crystal 122 (i.e., the same seed crystal used to pull the first ingot or a different seed crystal) is lowered to contact the melt. In accordance with embodiments of the present disclosure, the ratio of the mass $M_2$ of the second batch of buffer members added to the melt to the time $T_2$ between adding the second batch of buffer members to the start of growth of the main body of the ingot is controlled to be greater than the threshold M/T (i.e., the threshold M/T referenced above) to reduce void counts in wafers sliced from the second single crystal silicon ingot. In this regard, there may be an amount of the first batch of buffer members that still remain in the melt when the second batch is added. An amount (or the entire amount) of the first batch may be depleted due to dissolution within the silicon melt. The first batch that remains in the melt generally is not part of the mass $M_2$ of the second batch.

The ingot puller apparatus 5 may include a buffer member feed system 55 (FIG. 2) for adding batches of buffer members 35 to the outer melt zone 42. The buffer system 55 may be configured for autonomous addition of buffer member 35 or for manual addition. For example, the buffer member feed system 55 may include a storage vessel which contains buffer members (e.g., quartz cullets) and a metering device (e.g., weigh hoppers, metering wheels or the like). The buffer member feed system 55 may include a buffer member feeding tube which may be the same tube 46 as which polysilicon is added or may be a separate tube. Buffer members 35 may be weighed out by an operator or automatically fed to the tube by the buffer member feed system 55.

Compared to conventional methods for growing single crystal silicon ingots in a continuous Czochralski (CCz) process, the methods of the present disclosure have several advantages. By controlling the ratio of the mass M of the batch of buffer members added to the melt to the time T between adding the batch of buffer members to the melt and when the main body of the single crystal silicon ingot begins to grow to be greater than threshold value of M/T, the void count of wafers sliced from ingots grown in such continuous Czochralski methods may be reduced. For example, such wafers may have less than 30 defects per wafer (of a size 0.2 μm or more and measured by a SP1 inspection tool). Without being bound by any particular theory, it is believed that addition of polycrystalline silicon into the outer melt zone of the crucible assembly creates relatively small bubbles (e.g., less than 10 μm) of the inert gas (e.g., argon) that can be carried by the melt through the openings within each weir which allows bubbles to reach the solid-melt interface. The buffer members may act to prevent entrapment of the inert gas into the melt by preventing polycrystalline feedstock from dumping directly into the melt. The buffer members may also provide surface area and nucleation points for inert gas bubbles to aggregate, thereby increasing the size of the bubbles to allow them to become buoyant. By increasing the ratio of the mass M of the batch of buffer members added to the melt to the time T between adding the batch of buffer members to the melt and the start of the ingot main body growth to be at least 60 grams/hour, the efficiency of the buffer members in reducing inert gas impingement and/or dissipation of inert gas bubbles is increases.

EXAMPLES

The processes of the present disclosure are further illustrated by the following Examples. These Examples should not be viewed in a limiting sense.

Example 1: Number of Voids in Wafers Grown from Ingots in which M/T was Less than a Threshold Value of M/T Single crystal silicon ingots were grown in a continuous Czochralski method in an ingot puller apparatus similar to the apparatus shown in FIG. 3. The silicon ingots were grown with a 300 mm main body portion and were doped with red phosphorous. An initial charge of polycrystalline silicon was added to the outer melt zone, middle melt zone and inner melt zone. Quartz cullets (4 kg) were added to the top of the polycrystalline feedstock in the outer melt zone. After the charge was melted, additional polycrystalline silicon was added through the polycrystalline silicon feed system until the initial charge was fully formed. A batch of quartz cullets (1 kg) was added to the melt. A seed crystal was lowered and a single crystal silicon ingot was grown from the melt. Subsequent ingots were grown while maintaining the hot zone at temperature (i.e., from the same melt without cooling the hot zone down). A batch (1.5 kg) of buffer members (quartz cullets) was added to the outer melt zone before growth of each subsequent ingot. The first run of ingots was growth with the ratio of the mass M of the batch of buffer members added to the melt to the time T between adding the batch of buffer members to the melt and the start of growth of the ingot main body being less than a threshold M/T (in this case less than 60 grams/hour). A second run of ingots was grown after the first run with the ratio of M/T being greater than the threshold M/T (i.e., 60 grams/hour or more). As indicated, one ingot in the second run was grown with M/T less than the threshold M/T for confirmation of the effect.

Figure 4:
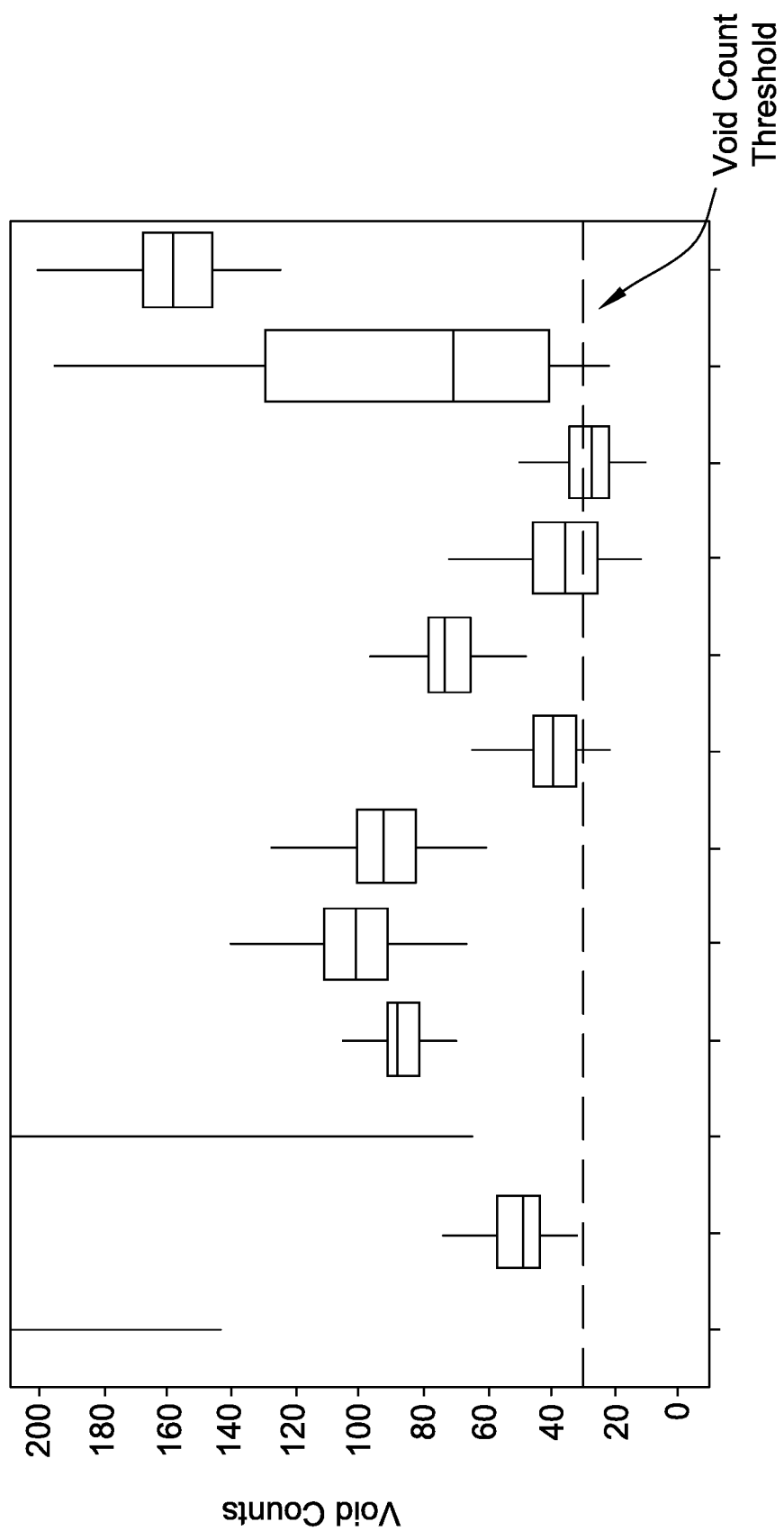
FIG. 4 is a box plot showing void counts in wafers sliced from ingots in which M/T was less than a threshold M/T.
Figure 5:
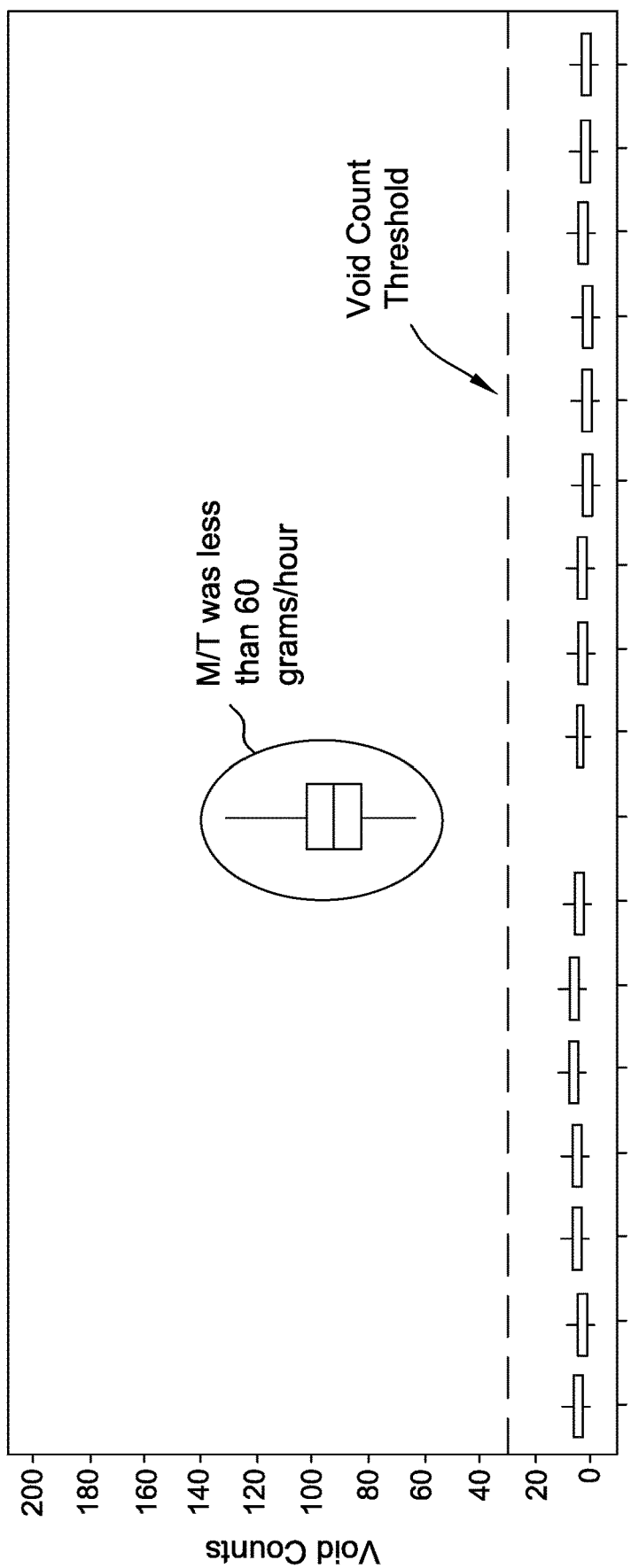
FIG. 5 is a box plot showing void counts in wafers sliced from ingots in which M/T was greater than a threshold M/T.
Figure 6:
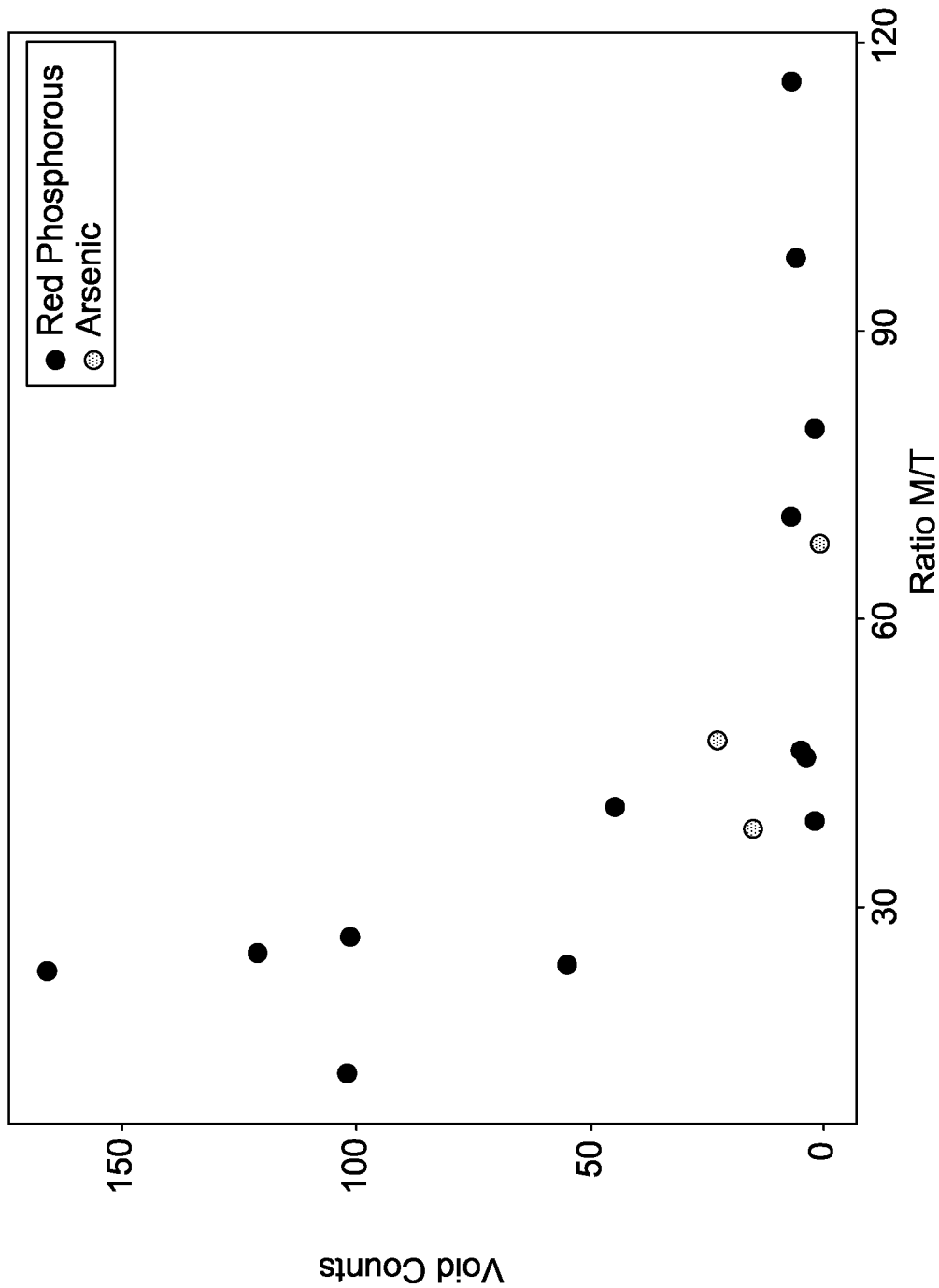
FIG. 6 is a scatter plot showing the defect counts as a function of M/T.

The defect counts in wafers sliced from ingots of the first run (M/T less than the threshold M/T) and ingots of the second run (M/T greater than the threshold M/T) are shown in FIGS. 4 and 5, respectively. As may be seen from comparing the figures, increasing M/T to the threshold M/T reduced the defect growth of the wafers to less than 30 defects/wafer, thereby increasing the amount of wafers that were within customer specification. FIG. 6 is a scatter plot showing the defect counts as a function of the M/T ratio (both for the red phosphorous ingots and for other ingot runs which were arsenic doped). As shown in FIG. 6, the defect counts were below 30 defects/wafer for all runs in which M/T was greater than a threshold M/T.

Example 2: Axial Trend in Defect Counts

Figure 7:
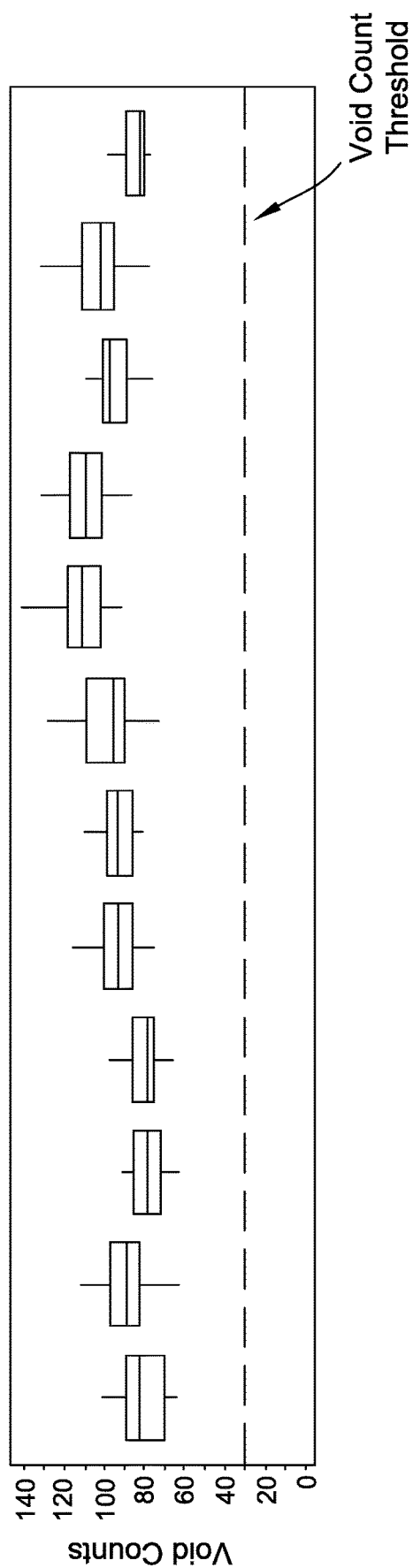
FIG. 7 is a box plot of wafers sliced from an ingot in which M/T was less than a threshold M/T.
Figure 8:
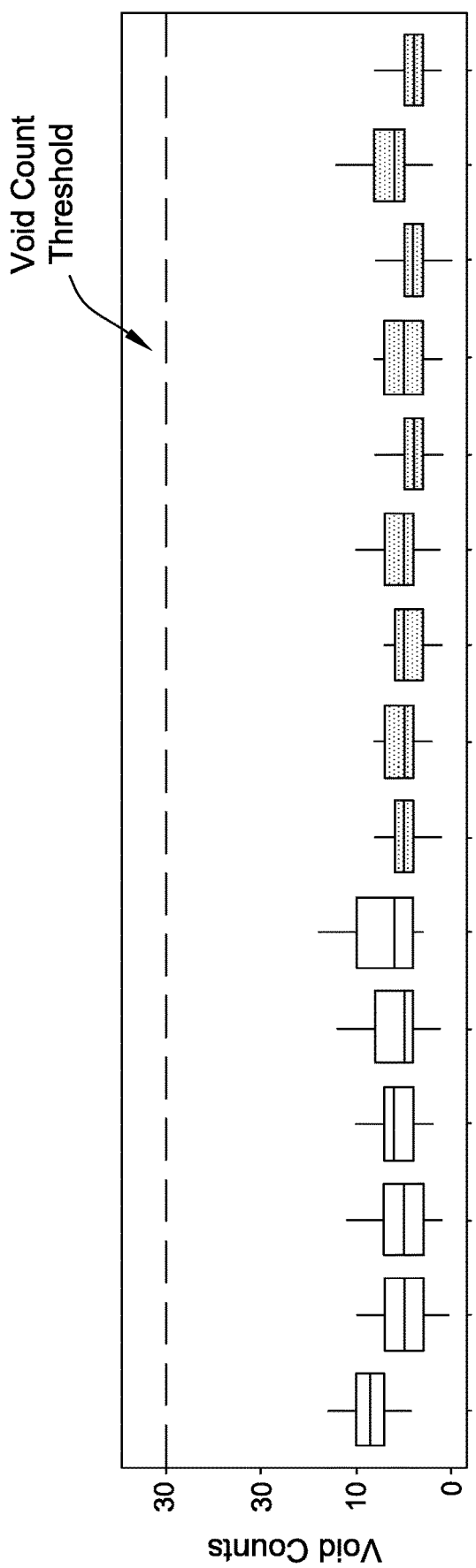
FIG. 8 is a box plot of wafers sliced from an ingot in which M/T was greater than a threshold M/T.

FIG. 7 shows the defect counts of wafers sliced along the axis of an ingot grown by the process of Example 1 in which M/T was about 27 grams/hour. As shown in FIG. 7, the defect counts across the entire axis of the ingot were greater than 30 defects/wafer. FIG. 8 shows the defect counts of wafers sliced along the axis of an ingot grown by the process of Example 1 in which M/T was about 70 grams/hour. As shown in FIG. 8, the defect counts across the entire axis of the ingot were less than 30. Ingots grown under both conditions exhibited axial uniformity in defects. This demonstrates that buffer members do not need to be added during growth of the ingot main body.

Example 3: Determination of Threshold M/T for an Ingot Puller Apparatus

Figure 9:
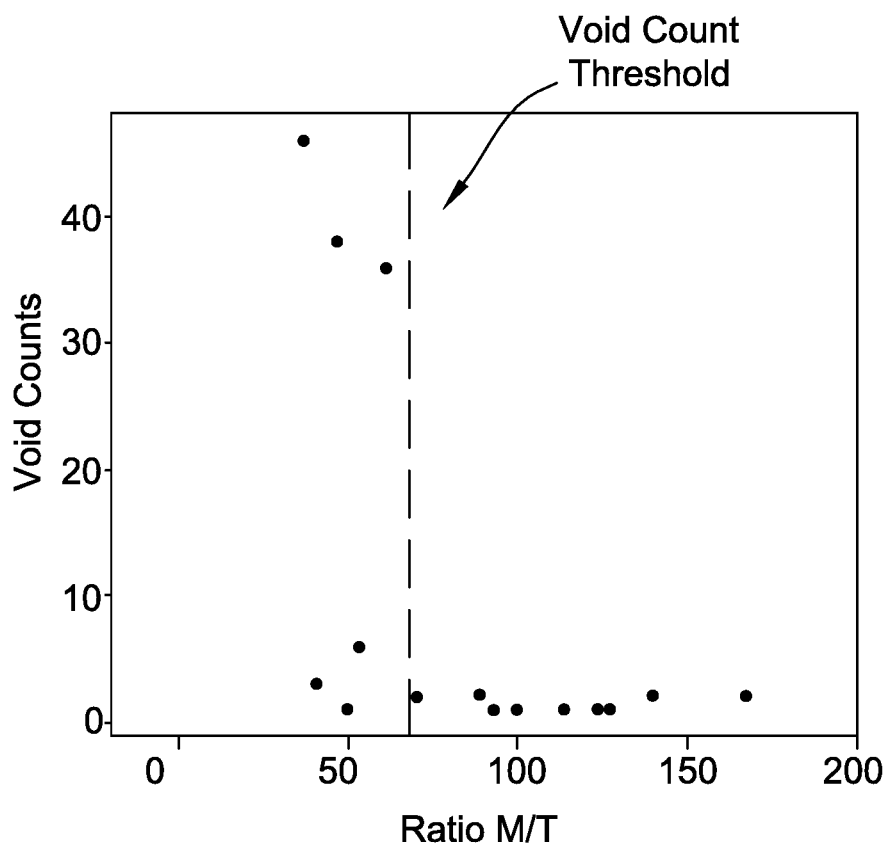
FIG. 9 is a scatter plot showing the defect counts as a function of M/T for another ingot puller apparatus.

FIG. 9 is a scatter plot showing the defect counts as a function of the M/T ratio for wafers sliced from single crystal silicon ingots similar to the apparatus shown in FIG. 3. The ingot puller apparatus was a different apparatus than the ones used in Examples 1-2. As shown in FIG. 9, a minimum threshold value of M/T of 70 grams/hour resulted in defect counts below 30 defects/wafer for all runs in which M/T was greater than the threshold M/T. The threshold M/T (i.e., minimum) for the ingot puller apparatus was determined to be about 70 grams/hour.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for growing a single crystal silicon ingot in a continuous Czochralski process, the method comprising:
    forming a melt of silicon in a crucible assembly;
    adding a batch of quartz cullets to the melt, the batch having a mass M;
    contacting a surface of the melt with a seed crystal;
    withdrawing the single crystal silicon ingot from the melt, the single crystal silicon ingot comprising a main body, there being a time T between adding the batch of quartz cullets to the melt and start of growth of the main body;
    controlling the ratio of M/T to be greater than a threshold M/T to reduce void counts in wafers sliced from the single crystal silicon ingot; and
    adding solid polycrystalline silicon feedstock to the crucible assembly while withdrawing the single crystal silicon ingot to replenish the melt.

2. The method as set forth in claim 1 further comprising slicing a plurality of wafers from the single crystal silicon ingot, wherein the ratio of M/T is controlled to be greater than the threshold M/T such that the wafers sliced from the single crystal silicon ingot have a void count of less than 30 voids of a size of 0.2 μm or more.

3. The method as set forth in claim 1 further comprising slicing a plurality of wafers from the single crystal silicon ingot, wherein the ratio of M/T is controlled to be greater than the threshold M/T such that the wafers sliced from the single crystal silicon ingot have a void count of less than 20 voids of a size of 0.2 μm or more.

4. The method as set forth in claim 1 comprising determining the threshold M/T by:
    growing a plurality of single crystal silicon ingots with at least two of the ingots being grown with different ratios of M/T;
    measuring a void count in one or more wafers sliced from the plurality of single crystal silicon ingots; and
    determining the ratio of M/T for single crystal silicon ingots from which wafers were sliced having a void count below a threshold void count.

5. The method as set forth in claim 4 wherein the threshold void count is 30 voids of a size of 0.2 μm or more.

6. The method as set forth in claim 1 wherein the threshold M/T is 40 grams per hour.

7. The method as set forth in claim 1 wherein the threshold M/T is 60 grams per hour.

8. The method as set forth in claim 1 wherein the batch of quartz cullets is a first batch and the single crystal silicon ingot is a first crystal silicon ingot, the method comprising:
    terminating growth of the first single crystal silicon ingot;
    adding a second batch of quartz cullets to the melt, the second batch having a mass $M_2$;
    contacting a surface of the melt with a seed crystal; and
    withdrawing a second single crystal silicon ingot from the melt, the second single crystal silicon ingot comprising a main body, there being a time $T_2$ between adding the second batch of quartz cullets to the melt and start of growth of the main body, wherein the ratio of $M_2/T_2$ is controlled to be greater than the threshold M/T to reduce void counts in wafers sliced from the second single crystal silicon ingot.

9. The method as set forth in claim 1 wherein the crucible assembly comprises a weir and a sidewall that define an outer melt zone between the weir and the sidewall, the batch of quartz cullets being added to the outer melt zone.

10. The method as set forth in claim 9 wherein the weir is a first weir, the crucible assembly comprising a second weir radially inward to the first weir, the first weir and second weir defining a middle melt zone between the first weir and the second weir, the second weir defining an inner melt zone within the second weir.

11. The method as set forth in claim 1 wherein the melt of silicon in the crucible assembly is formed by adding an initial charge of solid polycrystalline silicon to the crucible assembly, the method comprising:
  adding the batch of quartz cullets to the initial charge of solid polycrystalline silicon; and
  melting the initial charge of solid polycrystalline silicon with the quartz cullets being disposed therein.

12. The method as set forth in claim 1 wherein the quartz cullets are less dense than the melt of silicon such that the quartz cullets float within the melt.

13. The method as set forth in claim 1 wherein the single crystal silicon ingot is the first ingot withdrawn from the melt after the melt of silicon in the crucible assembly is formed.

14. The method as set forth in claim 1 wherein the single crystal silicon ingot is a single crystal silicon ingot grown subsequent to a first single crystal silicon ingot being withdrawn from the melt.

15. The method as set forth in claim 1 wherein the batch of quartz cullets are not added to the melt while the main body of the single crystal silicon ingot is withdrawn from the melt.

16. The method as set forth in claim 1 wherein the batch of quartz cullets are not added to the melt while a neck and/or crown of the single crystal silicon ingot is withdrawn from the melt.

* * * * *